(12) United States Patent
Zhang

(10) Patent No.: US 10,334,766 B2
(45) Date of Patent: Jun. 25, 2019

(54) SHIELD STRUCTURE

(71) Applicant: Shenzhen Sunway Communication Co., Ltd., Bao'an District, Guangdong (CN)

(72) Inventor: Haijun Zhang, Bao'an District (CN)

(73) Assignee: SHENZHEN SUNWAY COMMUNICATION CO., LTD., Guangdong (CN)

( * ) Notice: Subject to any disclaimer, the term of this patent is extended or adjusted under 35 U.S.C. 154(b) by 197 days.

(21) Appl. No.: 15/118,360

(22) PCT Filed: Jul. 13, 2016

(86) PCT No.: PCT/CN2016/089931
§ 371 (c)(1),
(2) Date: Aug. 11, 2016

(87) PCT Pub. No.: WO2017/152562
PCT Pub. Date: Sep. 14, 2017

(65) Prior Publication Data
US 2018/0199473 A1 Jul. 12, 2018

(30) Foreign Application Priority Data

Mar. 11, 2016 (CN) .................. 2016 2 0189918 U

(51) Int. Cl.
*H05K 9/00* (2006.01)
*F28F 9/007* (2006.01)

(52) U.S. Cl.
CPC ......... *H05K 9/0073* (2013.01); *H05K 9/0032* (2013.01); *F28F 9/0075* (2013.01); *F28F 2255/02* (2013.01)

(58) Field of Classification Search
CPC ................................................. H05K 9/0032
See application file for complete search history.

(56) References Cited

U.S. PATENT DOCUMENTS

| 7,084,356 B2 * | 8/2006 | English | B23K 1/0016 |
| | | | 174/361 |
| 9,913,413 B2 * | 3/2018 | Kurz | H05K 7/2039 |
| 2016/0113161 A1 * | 4/2016 | Ball | H05K 9/0032 |
| | | | 174/381 |
| 2017/0231123 A1 * | 8/2017 | Ball | H05K 9/0032 |
| 2018/0103539 A1 * | 4/2018 | Wanner | H05K 1/0216 |

* cited by examiner

*Primary Examiner* — Hung V Ngo
(74) *Attorney, Agent, or Firm* — Stein IP, LLC

(57) ABSTRACT

A shield structure includes a shield bracket, a shield cover, and a shield layer. The shield cover is formed with openings. The shield layer is spliced with the shield cover through a conductive tape layer and covers all openings. The shield cover is formed with openings and a light shield layer is spliced with the shield cover and covers the openings, greatly reducing the weight of the shield cover while ensuring the shielding effect, without compressing space for other elements. The shield layer is thin, capable of lowering down the shield, dissipating heat effectively, reducing the temperature of the whole machine and providing a good environment for the operation of the whole machine, without affecting the shielding effect; and the conductive tape layer is spliced with the shield layer, thus allowing multiple assembling without damaging the whole structure, and facilitating subsequent repair.

12 Claims, 2 Drawing Sheets

SHIELD STRUCTURE

CROSS-REFERENCE TO RELATED APPLICATIONS

This application is a national stage of International Application No. PCT/CN2016/089931, filed Jul. 13, 2016, which claims the benefit of priority to Chinese Application No. 201620189918.X, filed Mar. 11, 2016, in the State Intellectual Property Office, the disclosures of which are incorporated in their entireties herein by reference.

TECHNICAL FIELD

The utility model relates to the field of shielding equipment, in particular to a shield structure.

DESCRIPTION OF THE RELATED ART

In order to prevent mutual interference among circuit elements or chip modules, usually a shield is used to shield elements or chip modules. A current shield is formed by assembling a shield cover on a shield bracket. As shown in FIG. 1, a shield bracket 1 and a shield cover 2 are both formed by metal punching; and the shield bracket 1 or the shield cover 2 is punched with convex closures 3 to be fastened with the other. However, this solution has the following disadvantages:

a. The shield cover is formed by punching, and the materials must have a certain thickness to ensure the strength thereof.

b. After assembling, repeated assembling and disassembling tends to cause deformation to the cover, and tends to generate a problem of poor shielding effect, a problem of the falling off of the cover, a short-circuiting problem because the cover interferes with other elements after deformation, etc.

c. The shield is relatively heavy, compressing the space for other elements while increasing the weight of the whole machine.

d. Poor heat dissipation, tending to cause the temperature rise for the whole machine.

CONTENTS OF THE UTILITY MODEL

In order to solve the above technical problems, the utility model employs the following technical solution: A shield structure includes a shield bracket and a shield cover, and also includes a shield layer. The shield cover is formed with openings. The shield layer is spliced with the shield cover through a conductive tape layer and covers all openings.

The shield layer is a copper foil, aluminum foil or FPC.

One or more openings are formed.

A plurality of openings are formed, and each opening is correspondingly provided with a shield layer.

The shield cover is fastened with the shield bracket through convex closures.

The opening area accounts for over 50% of the roof area of the shield cover.

The thickness of the shield layer is 0.03-0.15 mm.

The utility model has the following beneficial effects: the shield cover is formed with openings and a light shield layer is spliced with the shield cover and covers the openings, greatly reducing the weight of the shield cover while ensuring the shielding effect, without compressing space for other elements; and, the shield layer is thin, capable of lowering down the shield, dissipating heat effectively, reducing the temperature of the whole machine and providing a good environment for the operation of the whole machine, without affecting the shielding effect; and the conductive tape layer is spliced with the shield layer, thus allowing multiple assembly without damaging the whole structure, and facilitating subsequent repair.

DESCRIPTION OF SEVERAL VIEWS OF THE ATTACHED DRAWINGS

DESCRIPTION OF MARKS 1. shield bracket; 2. shield cover; 3. convex closure; 4. shield layer; 5. opening.

DETAILED DESCRIPTION OF THE UTILITY MODEL

Figure 1:
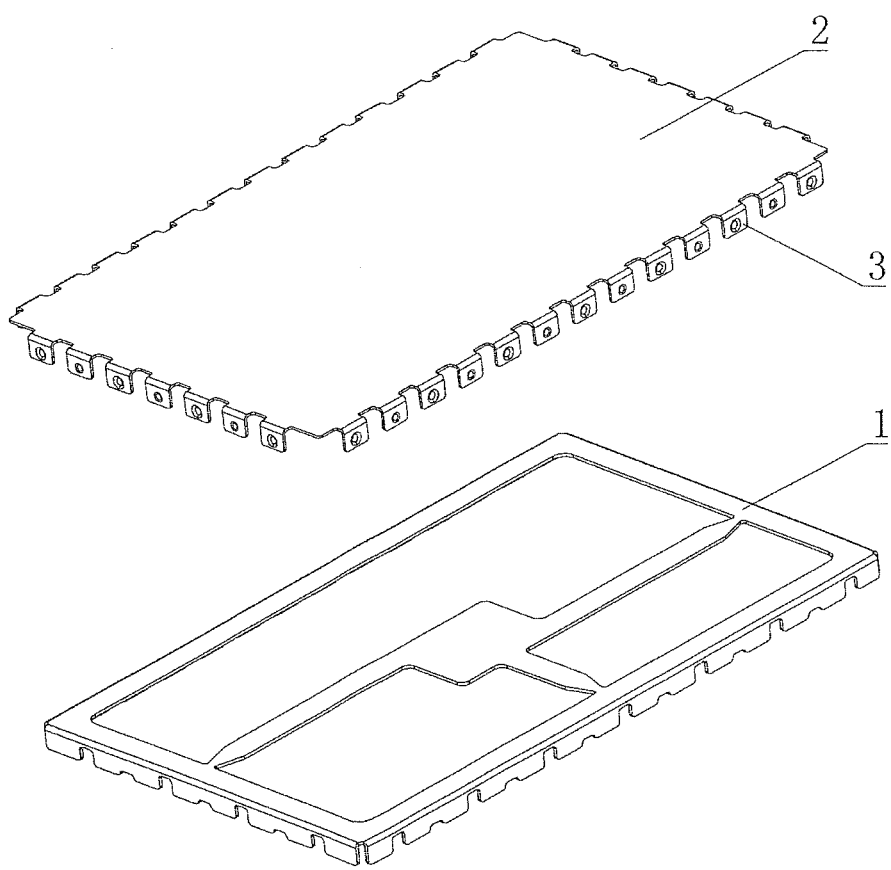
FIG. 1 is an exploded view of a shield structure in the prior art.
Figure 2:
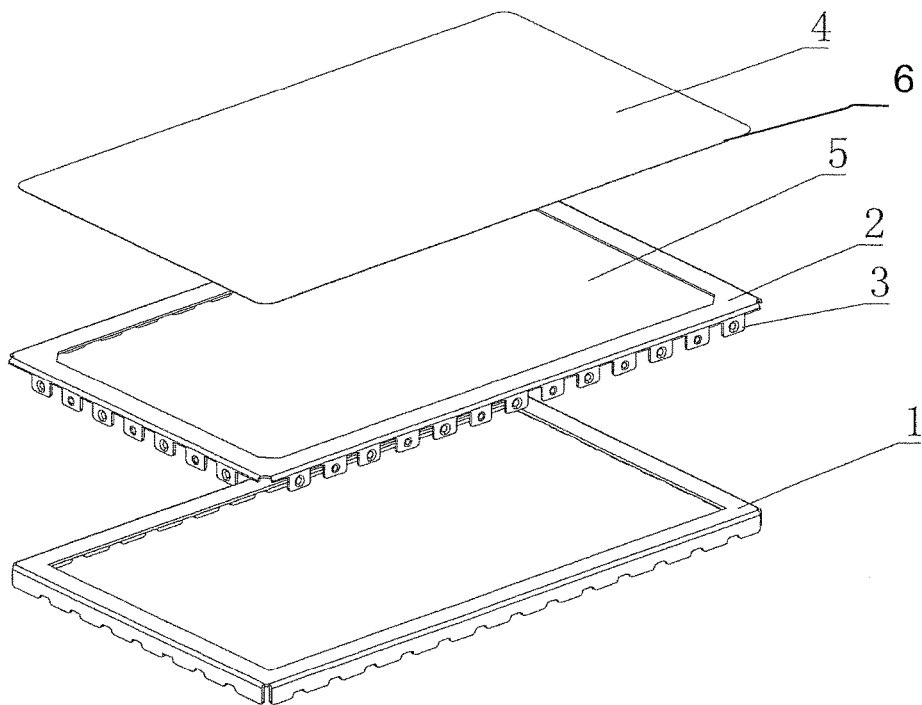
FIG. 2 is a structural exploded view of a shield structure of the utility model.

Refer to FIG. 2. A shield structure includes a shield bracket and a shield cover, and also includes a shield layer. The shield cover is formed with openings. The shield layer is spliced with the shield cover through a conductive tape layer and covers all openings.

From the above description it is known that the utility model has the beneficial effects of greatly reducing the weight of the shield cover, allowing multiple assembly without damaging the whole structure, and facilitating subsequent repair.

Wherein, the shield layer is a copper foil, aluminum foil or FPC.

From the above description, it is known that the shield layer made from a thin and flexible material can greatly reduce the weight of the shield cover, can realize shielding from curved 3D products, can also effectively dissipate heat and reduce the temperature of the whole machine, and provides a good environment for the operation of the whole machine.

Wherein, one or more openings are formed.

Wherein, a plurality of openings are formed, and each opening is correspondingly provided with a shield layer.

From the above description, it is known that the number of openings depends on the actual demands, which is highly adaptive and strongly practicable.

Wherein, the shield cover is fastened with the shield bracket through convex closures.

From the above description, it is known that the shield cover is firmly fastened to avoid short-circuiting due to interference with other elements.

Wherein, the opening area accounts for over 50% of the roof area of the shield cover.

From the above description, it is known that the overall weight of the shield can be effectively reduced.

Wherein, the thickness of the shield layer is 0.03-0.15 mm.

From the above description, it is known that the thickness of the shield cover can be effectively reduced, and the overall size of the shield can be reduced.

Embodiment 1

Figure 3:
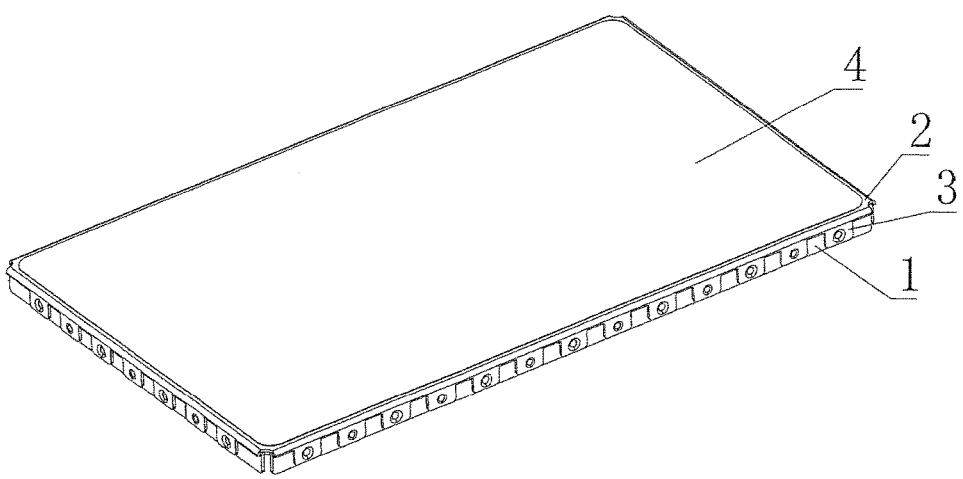
FIG. 3 is an overall structural view of a shield structure of the utility model.

Refer to FIG. 2. According to one embodiment of the utility model, a shield structure, capable of being applied to the electromagnetic shielding of electric appliances and chips on circuit boards, includes a shield bracket 1 and a shield cover 2 and also includes a shield layer 4. The shield cover 2 is formed with openings 5. The shield layer 4 is spliced with the shield cover 2 through a conductive tape layer 6 and covers the openings 5. When the shield is disposed on a chip, a closed cavity is formed, thus playing the shielding role. The overall structure can be seen in FIG. 3.

Optimally, the shield layer 4 is a copper foil, aluminum foil or FPC, and of course may be other metal layers.

Optionally, as shown in FIG. 2, one opening 5 is formed, capable of reducing the weight of the shield cover 2 to the maximum extent.

Optionally, a plurality of openings 5 are formed, capable of ensuring the structural strength thereof while reducing the weight of the shield cover 2. In the case of a plurality of openings 5, the shield layer 4 may be one piece, or every opening 5 may be correspondingly provided with a shield layer 4, as long as all openings 5 are covered.

Optimally, the opening 5 area accounts for over 50% of the roof area of the shield cover 2, optimally over 60%, further optimally over 80%, capable of effectively reducing weight.

Optimally, the thickness of the shield layer 4 is 0.03-0.15 mm.

The shield cover 2 is fastened with the shield bracket 1 through the convex closures 3; optionally, the convex closures 3 can be disposed on the shield cover 2, and can also be disposed on the shield bracket 1.

Optionally, the area of the shield layer 4 is a little greater than the area of the opening 5, and the conductive tape layer 6 is disposed on the edge and a lateral side of one face, covering the opening 5, of the shield layer 4, so the shield layer 4 is spliced on the shield cover 2.

The shield cover 2 is fastened with the shield bracket 1 through the convex closures 3 such that the shield cover 2 does not fall easily and is prevented from interfering with other elements after falling and accordingly causing short-circuiting. When it is needed to replace a chip after repair, the shield layer 4 is directly removed. The copper foil, aluminum foil or FPC has good roughness and therefore is reusable.

The shield may have different shapes, for example regular or irregular shapes, capable of being set according to the shape of the chip. Therefore, except realizing the shielding of flat products, the shield can also realize shielding of curved 3D products.

In the utility model, a light layer is spliced with the shield cover and covers the openings, thus greatly reducing the weight of the shield cover, without compressing space for other elements; and, the shield layer is thin, capable of lowering down the shield without affecting the shielding effect; meanwhile, a thin and flexible material is used as the shield layer, capable of dissipating heat effectively to reduce the temperature of the whole machine and provide a good environment for the operation of the whole machine.

In conclusion, according to the shield structure provided by the utility model: the shield cover is formed with openings and a light shield layer is spliced with the shield cover and covers the openings, greatly reducing the weight of the shield cover while ensuring the shielding effect, without compressing space for other elements; the conductive tape layer is spliced with the shield layer, thus allowing multiple assembly without damaging the overall structure and facilitating subsequent repair; the shield layer is made from a thin and flexible material, capable of lowering down the shield, realizing shielding of curved 3D products, effectively dissipating heat, reducing the temperature of the whole machine and providing a good environment for the operation of the whole machine, without affecting the shielding effect.

The invention claimed is:

1. A shield structure, comprising:
a shield bracket;
a shield cover; and
a shield layer;
wherein:
the shield cover is formed with one or more openings,
the shield cover is situated on the shield bracket, and
the shield layer is situated on the shield cover and extending beyond the one or more openings in a surface direction of the shield cover, with a conductive tape layer holding a bottom surface of the shield layer and a top surface of the shield cover together, and the shield layer covers all of the one or more openings.

2. The shield structure according to claim 1, wherein the shield layer is one of a copper foil, aluminum foil and FPC.

3. The shield structure according to claim 2, wherein an area of the one or more openings accounts for over 50% of a roof area of the shield cover.

4. The shield structure according to claim 2, wherein a thickness of the shield layer is 0.03-0.15 mm.

5. The shield structure according to claim 1, wherein the one or more openings are a plurality of openings, and each opening is provided with a corresponding shield layer.

6. The shield structure according to claim 5, wherein an area of the one or more openings accounts for over 50% of the roof area of the shield cover.

7. The shield structure according to claim 5, wherein a thickness of each corresponding shield layer is 0.03-0.15 mm.

8. The shield structure according to claim 1, wherein the shield cover is fastened with the shield bracket through convex closures.

9. The shield structure according to claim 8, wherein an area of the one or more openings accounts for over 50% of a roof area of the shield cover.

10. The shield structure according to claim 8, wherein a thickness of the shield layer is 0.03-0.15 mm.

11. The shield structure according to claim 1, wherein an area of the one or more openings accounts for over 50% of a roof area of the shield cover.

12. The shield structure according to claim 1, wherein a thickness of the shield layer is 0.03-0.15 mm.

\* \* \* \* \*